United States Patent [19]

Chubb et al.

[11] Patent Number: 4,472,807

[45] Date of Patent: Sep. 18, 1984

[54] RF LASER ARRAY DRIVER APPARATUS

[75] Inventors: Charles R. Chubb, St. Louis County; Victor H. Nettle, Jr., St. Louis, both of Mo.

[73] Assignee: The United States of America as represented by the Secretary of the Air Force, Washington, D.C.

[21] Appl. No.: 289,660

[22] Filed: Aug. 3, 1981

[51] Int. Cl.³ .............................................. H01S 3/00
[52] U.S. Cl. ........................................ 372/38; 372/29; 307/311
[58] Field of Search ...................... 372/29, 26, 38, 64, 372/83, 50, 82; 307/317 R, 311

[56] References Cited

U.S. PATENT DOCUMENTS

| 3,621,455 | 11/1971 | Green et al. | 372/82 |
| 3,942,132 | 3/1976 | Zinn | 372/50 |
| 4,009,385 | 2/1977 | Seu | 372/38 |
| 4,032,802 | 6/1977 | Pan et al. | 307/311 |

OTHER PUBLICATIONS

Campbell et al., "Semiconductor Diode Lasers", p. 102.
Vanderwall, "Subnanosecond Rise Time Pulses from Injection Lasers", IEEE J. Quant. Electronics, Jul. 1979, pp. 570–572.
Swartz, "An Integrated Circuit for Multiplexing and Driving Injection Lasers", IEEE J. of Solid–State Circuits SC–17, No. 4, Aug. 1982.

Primary Examiner—William L. Sikes
Assistant Examiner—Léon Scott, Jr.
Attorney, Agent, or Firm—Donald J. Singer; William Stepanishen

[57] ABSTRACT

An RF laser array driver apparatus with a DC bias input and and RF input to modulate a diode array and provide a modulated optical output. The driver circuit comprises a series impedance which is in parallel with the diode array to provide a 50 ohm impedance to the RF input signal that is substantially constant with frequency.

6 Claims, 3 Drawing Figures

4,472,807

RF LASER ARRAY DRIVER APPARATUS

STATEMENT OF GOVERNMENT INTEREST

The invention described herein may be manufactured and used by or for the Government for governmental purposes without the payment of any royalty thereon.

BACKGROUND OF THE INVENTION

The present invention relates broadly to laser array devices, and in particular to a laser array driver apparatus. Modulated lasers have been demonstrated as suitable illuminators in optical systems. In particular, CW GaAlAs lasers are especially desirable for use because they are efficient, small in size, and their output is not readily visible. In order to extract more information, some systems utilize RF current modulation of the GaAlAs sources. In addition to providing more information, the modulation of these lasers in the megahertz frequency range provides higher peak and higher average output power. Single reliable GaAlAs lasers have been fabricated which produce high power for optical illumination applications. Individual diodes were hand-picked for these demonstrations. The difficulties are that these have not been produced in quantity at low cost and that they require cryogenic cooling which is undesirable in field applications. Another problem is that a single laser source and detector requires the incorporation of some sort of flying spot scanner which introduces system problems including size, complexity, power consumption, jitter, and noise. Alternatively, a single high power linear array of room temperature GaAlAs laser diodes could meet all of the system criteria while eliminating most of the problems.

SUMMARY OF THE INVENTION

The present invention utilizes an RF modulation circuit in combination with a laser diode array to provide a substantially constant load resistance of 50 ohms to an RF driver circuit. The RF modulation circuit comprises a fixed resistor in parallel with the diode laser array to provide a 50 ohm input impedance over a large operating frequency range to the RF driver circuit. An alternative embodiment comprises the use of an inductor in place of the resistor and fewer diodes in the laser diode array to the DC bias input electrical power.

It is one object of the present invention, therefore, to provide an improved RF laser array driver apparatus.

It is another object of the invention to provide an improved RF laser array driver apparatus to provide a flat impedance over a wide frequency range.

It is still another object of the invention to provide an improved RF laser array driver apparatus that is highly stable.

It is yet another object of the invention to provide an improved RF laser array driver apparatus in which the frequency may be varied without effect on the output pulse.

It is still another object of the invention to provide an improved RF laser array driver apparatus wherein the optical pulse accurately correlates with the drive pulse shape.

It is a further object of the invention to provide an improved RF laser array driver apparatus capable of high frequency operation up to 300 MHz.

These and other advantages, objects and features of the invention will become more apparent after considering the following description taken in conjunction with the illustrative embodiment in the accompanying drawings.

DESCRIPTION OF THE PREFERRED EMBODIMENT

Figure 1:
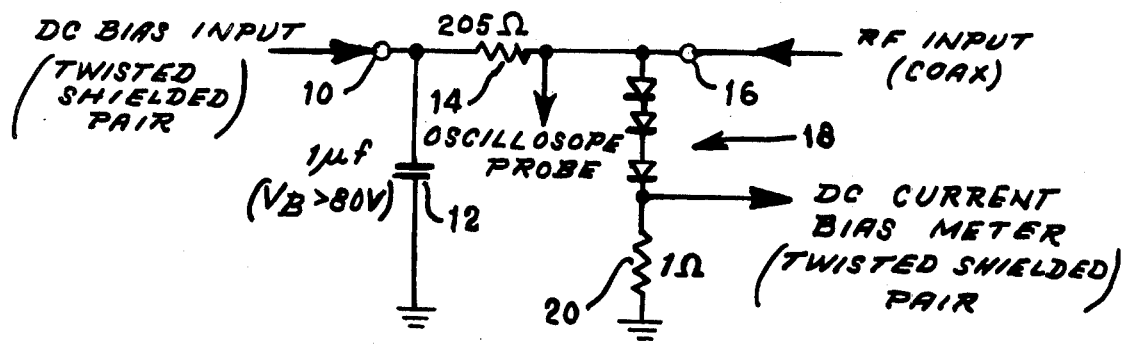
FIG. 1 is a schematic diagram of the RF laser array driver apparatus according to the present invention.

Referring now to FIG. 1, there is shown an RF laser array driver apparatus for wideband RF modulation. The DC bias input signal is applied to terminal 10 which is connected respectively to one end of capacitor 12 and to one end of resistor 14. The other end of capacitor 12 is connected to ground. The RF input signal is applied to terminal 16 which is connected to the other end of resistor 14 and to the laser diode array 18. A resistor 20 is connected between the laser diode array 18 and ground. In the present embodiment, the circuit components have the values shown in FIG. 1. The laser diode array 18 comprises twenty CW laser diodes with a dynamic resistance of 67 ohms. As indicated, an oscilloscope probe may be connected at the junction of resistor 14 and the laser diode array 18. In addition, a DC current bias meter may be connected at the junction of the laser diode array 18 and the resistor 20.

A linear diode array comprising 20 CW laser diodes was utilized in the present circuit. The laser diodes were stripe geometry CW GaAlAs diode material which were obtained from ITT Electro-Optics Products Division. The diodes had a 20 μm oxide strips, 150 μm cleave length, and high efficiency all dielectric facet reflectors. The diodes were soldered in a double-sided heat sink package 160 μm thick and the array configuration used spacers 90 μm thick for a total array length of about 5 mm for the 20 diodes. The diode array was air-cooled using 5 psi dry air.

The diodes in the diode array were selected from a much larger inventory such that for each diode the threshold currents were close to 70 mA range, output power was over 20 mW at 140 mA (twice over threshold), and the wavelengths were in a 20 nm range from 820 to 840 nm (measured at 100 mA dc drive level). None of the diodes selected had a single-mode characteristics and most of the diodes exhibited gross nonlinearities in the light versus current curves. The resulting array provided a linear performance due to the randomness of the nonlinearities of the individual laser diodes.

Figure 2:
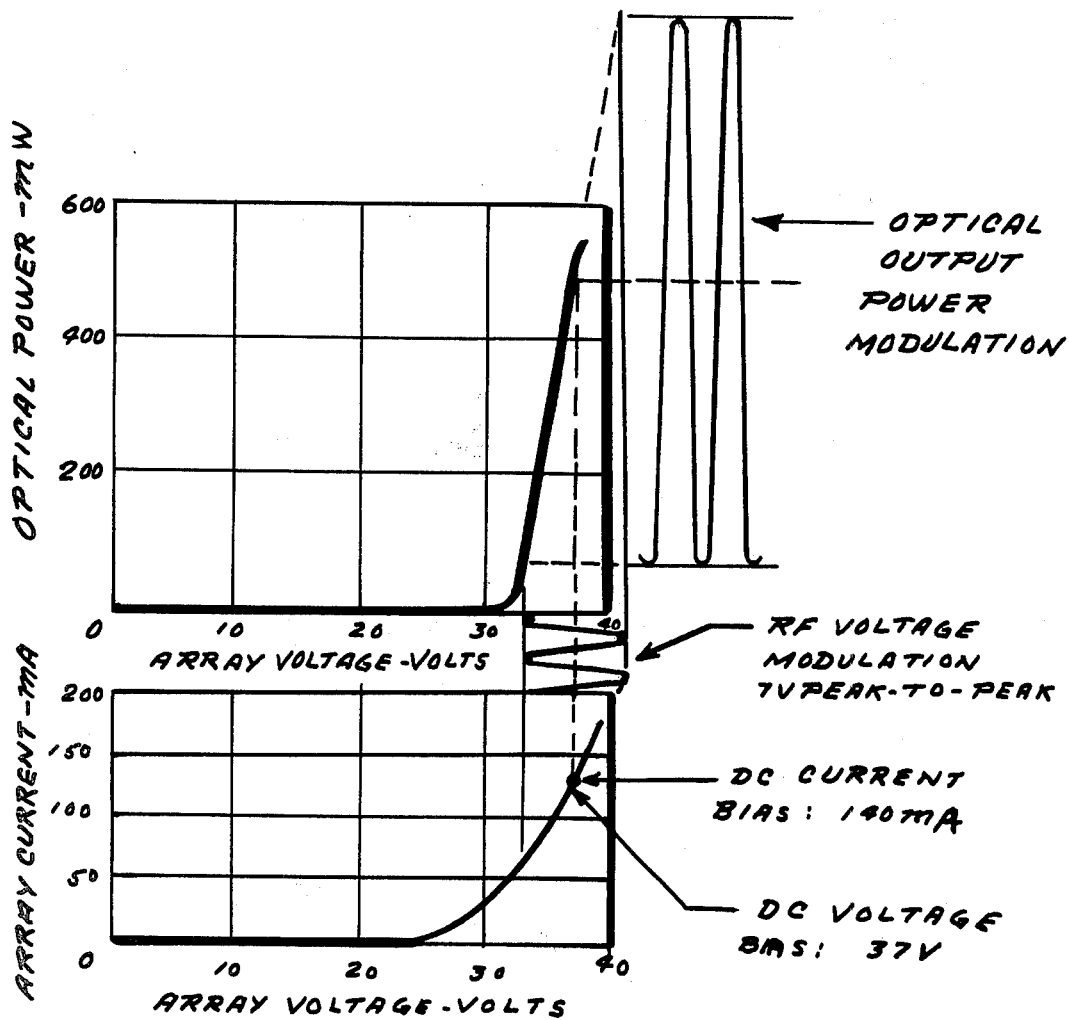
FIG. 2 is a graphical representation of the RF laser array driver apparatus input and output waveforms; and, FIG. 3 is a schematic diagram of an alternative embodiment of the RF laser array driver apparatus.

The dc bias input signal is used to set the average optical output of the laser array at 5000 mW using an input dc current through the laser diode array 18 of 140 mA with corresponding voltage across the array of 37 volts. The dc voltage across the 205 ohm resistor for the 0.14 A current is 29 volts such that the dc input bias voltage is 66 volts (37+29). By providing an input RF modulation voltage of 7 volts peak-to-peak, the optical power of the laser diode array 18 is modulated with an amplitude of approximately 800 mW peak-to-peak as shown in FIG. 2.

For the operational frequencies between 1 and 100 MHz the impedance of the 1 μf capacitor is less than 0.3 ohm. The RF input thus sees the 205 ohm resistor in parallel with the 67 ohm array (slope of the voltage current characteristic at 140 mA in FIG. 2). These two resistances provide an input impedance of 50 ohms which is required for efficient RF drive. In addition, since the array and 205 ohm carbon resistor have a low inductance, the impedance seen at the RF modulation input is a resistive load of 50 ohms over a wide range in frequencies.

The use of a 1 ohm resistor to monitor the bias current prevents the meter lead wire inductance and capacitance from having a large effect on the 50 ohm RF input impedance. If the impedance caused by the leads is much less than 1 ohm, the array to ground impedance will be reduced from 68 ohms to 67 ohms which results in a worse case RF impedance change of only 1% from the nominal 50 ohm value. The 1 µf capacitor keeps the DC bias input lead inductance and capacitance from significantly affecting the RF input impedance of 50 ohm over a wide frequency range.

The 205 ohm resistor serves to limit the array diodes current spikes caused by any voltage spikes on the DC bias input line. High current spikes in the laser diodes can cause shorts resulting in failure of the diodes (loss of optical output power).

Figure 3:
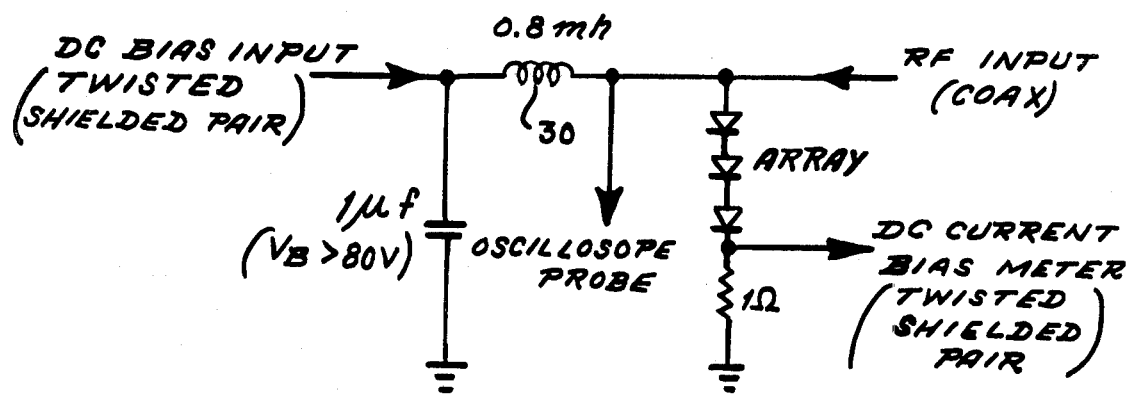

Referring now to FIG. 3, there is shown an alternative embodiment of the RF laser array driver apparatus. The circuit is basically the same as was shown and described in FIG. 1 except that the 205 ohm resistor (resistor 14 in FIG. 1) has been replaced with an inductor 30 and the laser diode array comprises fifteen CW laser diodes. The inductor 30 has a value of 0.8 mh. The fifteen CW laser diodes have a dynamic resistance of fifty ohms.

As was previously mentioned, the circuit which is shown in FIG. 3 utilizes a 15 diode array and an inductor in place of the 205 ohm series resistor to reduce the DC bias input electrical power. The impedance of the 0.8 millihenry blocking inductor for frequencies over 1 MHz is greater than 5000 ohms so that the impedance seen by the RF generator is primarily a 50 ohm resistive load. This 50 ohm load is an array of 15 diodes (49 ohm), and a series resistor, 1 ohm, for current monitoring.

In conclusion, we have shown that the linear injection laser diode array can be made to operate satisfactorily in modulated illuminator application using the laser array driver. The beam shape, spectral content, and modulation characteristics of the array is the summation of these properties of the individual diodes. Proper preselection of the diodes for these properties results in an array having excellent high power output cabability. In addition, degradation of individual laser diodes in the array reduces the total array output power but does not in other ways adversely affect the array operational properties. Proper drive characteristics result in either pure sinewave output or in short pulse output cababil- ity.

Although the invention has been described with reference to a particular embodiment, it will be understood to those skilled in the art that the invention is capable of a variety of alternative embodiments within the spirit and scope of the appended claims

What is claimed is:

1. In a laser system having a DC bias means to generate a DC bias input, a means for generating an RF signal and an RF laser array driver apparatus, the improvement which comprises:

a means providing a capacitance with first and second leads, a first impedance means providing an impedance, said first impedance means having a first and second lead, said first lead of said first impedance means connected to said first lead of said capacitance means to form a first input terminal, said first input terminal receiving a DC bias input, said second lead of said capacitance means connected to ground;

a diode array having a first and second lead, said first lead of said diode array being directly connected to said second lead of said first impedance means to form a second input terminal, said second input terminal receiving an RF signal, said first impedance means in combination with said diode array presenting an RF input impedance of 50Ω to said RF signal, said first impedance means limiting DC current to said diode array to a predetermined current level, said capacitance means preventing lead inductive and capacitive effects of said first input terminal from significantly effecting said RF input impedance of 50Ω over a wide frequency range, said RF signal modulating said diode array to provide a modulated optical output, and a second impedance means providing a second impedance, said second impedance means having a first and second lead, said first lead of said second impedance means connected to said second lead said diode array and said second lead of said second impedance means connected to ground.

2. An RF laser array driver apparatus as described in claim 1 wherein said capacitance means comprises a capacitor with a value of 1 microfarad and said impedance means comprises a resistor with a value of 205 ohms.

3. An RF laser array driver apparatus as described in claim 2 wherein said diode array comprises 20 laser diodes in series.

4. An RF laser array driver apparatus as described in claim 1 wherein said capacitance means comprises a capacitor with a value of 1 microfarad and said impedance means comprises an inductor with a value of 0.8 millihenries.

5. An RF laser array driver apparatus as described in claim 4 wherein said diode array comprises 15 laser diodes in series.

6. An RF laser array driver apparatus as described in claim 1 wherein said predetermined current level is 0.14 amperes.

* * * * *